United States Patent [19]
Stein et al.

[11] Patent Number: 5,998,036
[45] Date of Patent: Dec. 7, 1999

[54] DIELECTRIC PASTES AND TAPES, AND METAL SUBSTRATES COATED THEREWITH

[76] Inventors: Sidney J. Stein, 716 Great Springs Rd., Bryn Mawr, Pa. 19010; Richard L. Wahlers, 112 Cherry Blossom Dr., Churchville, Pa. 18966; Paul W. Bless, 7632 New 2nd St., Melrose Park, Pa. 19027; Charles Barclay, 7 Broomfield, Lightwater, Surrey, United Kingdom, GU185QN; Richard B. Tait, 7 High Tree Drive, Early, Reading, Berks, United Kingdom, RG6 1EU

[21] Appl. No.: 09/020,394

[22] Filed: Feb. 9, 1998

Related U.S. Application Data

[60] Provisional application No. 60/037,596, Feb. 11, 1997.

[51] Int. Cl.⁶ ...................................................... B32B 17/00
[52] U.S. Cl. ......................... 428/433; 428/469; 428/471; 501/66; 501/69; 501/70; 501/73; 501/77; 165/133; 165/905; 219/260; 338/258
[58] Field of Search ...................................... 428/433, 469, 428/471; 501/69, 70, 73, 77; 165/133, 433, 905; 219/260; 338/258

[56] References Cited

U.S. PATENT DOCUMENTS

| | | | |
|---|---|---|---|
| 4,618,590 | 10/1986 | Baudry | 501/69 |
| 4,707,458 | 11/1987 | Chyung | 501/69 |
| 4,897,509 | 1/1990 | Holleran | 501/69 |

*Primary Examiner*—Timothy Speer
*Attorney, Agent, or Firm*—Weingarten, Schurgin, Gagnebin & Hayes LLP

[57] ABSTRACT

The present invention relates to dielectric materials which may be used in the manufacture of, e.g., low profile heaters. Such dielectric materials comprise at least about 50% of a glass composition having about 35–50% $SiO_2$, about 30–40% of an alkaline earth metal oxide selected from the group consisting of CaO, MgO, and SrO, about 13—22% $Al_2O_3$, and about 0–10% $B_2O_3$, the percentages being weight percentages based on the weight of the total glass composition. Certain dielectric compositions of the disclosure have a linear thermal expansion coefficient in the range of about 6.0 to 9.0 ppm/° C.

26 Claims, No Drawings

DIELECTRIC PASTES AND TAPES, AND METAL SUBSTRATES COATED THEREWITH

CROSS REFERENCE TO RELATED APPLICATIONS

This application claims the benefit from U.S. Provisional Application 60/037,596, filed Feb. 11, 1997, the disclosure of which is incorporated herein by reference.

STATEMENT REGARDING FEDERALLY SPONSORED RESEARCH OR DEVELOPTMENT

N/A

BACKGROUND OF THE INVENTION

The electronics industry has placed increasing demands on substrates for dissipating larger and larger quantities of power. Similarly, applications involving domestic appliances and industrial instrumentation have begun to explore the advantages of size, weight and cost reduction for which the electronic industry has been the proving grounds.

Dielectric coated metals, with their excellent mechanical and thermal properties and their low cost potential, are a material of choice in a growing number of applications. These include under-the-hood automotive circuitry, surface-mounted components, hybrid circuit boards, multi-chip modules, and heaters, heat sensors and heat regulators in industrial and domestic applications. However, wet chemical processing requirements, temperature limitations, difficult fabrication processes and high cost associated with conventional aluminum and steel core (porcelain enamel) substrate approaches have restricted their usage in this regard.

Particularly in the area of heaters, it has been proposed to make such apparatus by, e.g., making substrates for printed circuits and then applying circuit tracks on the substrate, such as by screen printing, and then firing the printed material onto the substrate. The printed material may be either highly conductive, thus forming a printed conductor or may be in the form of resistive or dielectric layers. The material is typically applied in the form of a paste, and the substrate may be as noted above. Particularly advantageous are such substrates made of enamel steel. However, enamel steel substrates have been used typically only for special applications, due to the typically low softening temperature of the enamel, which limits firing temperatures of the respective pastes to below about 650° C., and due to their limited corrosion resistance.

Accordingly, it has been desired to provide a substrate suitable for use with printed circuits, which have robust mechanical properties and excellent corrosion resistance to make them attractive in a variety of domestic appliance applications. In particular, low profile heaters prepared by screen printing thick film circuitry on such substrates have been desired.

BRIEF SUMMARY OF THE INVENTION

The present invention relates to useful dielectric materials which may be applied to metal substrates so as to desirably enable their use in making heaters such as of the low profile variety. Broadly, such dielectric materials comprise at least about 50% of a glass composition having about 35–50% $SiO_2$, about 30–40% of an alkaline earth metal oxide selected from the group consisting of CaO, MgO, and SrO, about 13–22% $Al_2O_3$, and about 0–10% $B_2O_3$, the percentages are weight percentages based on the weight of the total glass composition.

In an embodiment, a dielectric material comprises at least about 50% of a glass composition having about 35–50% $SiO_2$, about 30–40% CaO, about 13–22% $Al_2O_3$, and about 0–10% $B_2O_3$, a density of about 2.0 to 3.5 g/cm$^3$, a softening point of about 750–900° C., a linear thermal expansion coefficient of about 6.0 to 9.0 ppm/° C., and less than about 5% of a glass pigment, preferably a cobalt-aluminate pigment. The disclosure is further directed towards stainless steel substrates having applied thereto the dielectric materials described herein. The compositions may be applied by screen printing, or as a tape composition which is laminated, e.g., upon application of heat and/or pressure, to the metal substrate.

DETAILED DESCRIPTION OF THE INVENTION

The dielectric coatings described herein comprise at least 50%, preferably at least 75%, and more preferably at least 90% by weight, of a glass composition comprising about 35–50% $SiO_2$; 30–40% of an alkaline earth metal oxide selected from the group consisting of CaO, MgO, and SrO; 13–22% $Al_2O_3$; and 0–10% $B_2O_3$, all percentages by weight of the total glass composition.

As for physical properties of this composition, the density of such compositions is typically in the range of from about 2.0–3.5 g/cm$^3$. The softening point (i.e., the Labino softening point as measured by the Harrop/Labino SP-3A softening point system manufactured by Harrop Industries, Inc., hereinafter "Labino method"), ranges from about 750°–900° C., and the linear thermal expansion coefficient is in the range of about 6.0 to 9.0 ppm/° C.

These compositions are advantageous in that they have a high glass transition temperature, $T_g$, and low ionic mobility, hence their suitability in the methods disclosed herein of making dielectric-coated heaters and the like. Furthermore, the beneficial properties of these compositions are surprisingly obtained, even though certain components of prior art compositions, i.e., oxides of alkali metals, and oxides of nickel (Ni), cadmium (Cd), barium (Ba) and lead (Pb), are substantially excluded.

Yet another advantage of these coatings is that desirable properties are obtainable in a thick film dielectric composition while still substantially excluding environmentally unfriendly elements such as Ba, Ni, Cd, and Pb which are used in the prior art. Preferred embodiments of our coatings exclude such components. However, it is contemplated that, if desired, small amounts of such compounds may be added, e.g., in amounts less than 20%, preferably less than 10%, more preferably less than 5%, by weight. However, even with the addition of small amounts of such compounds, such versions of these coatings are still environmentally friendlier than those of the prior art. Other compounds which do not adversely affect the advantageous properties of the basic composition may also be added if desired. For example, a minor amount, e.g., typically less than 5%, of a glass pigment typically used in the art, such as cobalt-aluminate pigments, may be added.

The coatings disclosed herein have high breakdown voltages and high insulation resistance. The coatings may be applied to any base metal material, such as stainless steel, such as is used in heater applications, to which good adhesion is possible. The properties of the coating are preferably matched to the substrate, e.g., linear thermal expansion coefficient, so that the coating adheres well to the substrate, and does not fracture or delaminate upon heating and cooling.

Furthermore, suitable substrates for use in conjunction with screen printing of the compositions disclosed herein desirably have high corrosion resistance, high temperature firing capability, and low TCE values, such as is found in high chromium content ferritic stainless steels.

Low profile heaters using coated metal substrates as disclosed herein may be made by screen printing heating elements (e.g., 0.7Ω/square Electro Science Laboratory's ESL 3900 resistor paste) in a desired path configuration that will yield the desired temperature uniformity and heat-up rate potential. Conductive contact pads, e.g., ESL 9695 Pd/Ag, and temperature control sensor(s) are then affixed, and fired onto the heater.

The benefits of the invention disclosed herein are further demonstrated in non-limiting fashion in the following Examples.

EXAMPLE 1

To demonstrate the benefits obtained by the compositions disclosed herein, experiments were conducted as follows. High chromium content ferritic stainless steel (430) was selected as a metal base material. The substrates were 50 mm×50 mm×1.6 mm. The steel samples were treated to remove dirt, oil and grease, and the surfaces were abraded and oxidized. Note that surface abrasion and/or oxidation is not required, but in some cases may be desirable. Where dielectric pastes were screen printed, the coated substrate was dried for 10 minutes at 125° C. and fired in continuous belt furnaces using 45 minute cycles with 10 minute hold times at a 850° C. peak temperature. Where substrates had applied thereto tape insulation comprising dielectric compositions in accordance with the disclosure, flexible sheets of MYLAR-backed dielectric tape were laminated to the metal substrate at 500–1000 psi and temperatures of 50° C.–95° C. Film densification and adherence was achieved by firing the laminated substrates in either continuous belt or box furnaces.

Coated metal substrates were prepared and insulated with a thick film dielectric composition representative of traditional 850° C. firing thick film dielectrics, for comparison, and a composition in accordance with the disclosure. This latter composition comprised about 97.5% of a glass composition comprising about 40% $SiO_2$, 37% CaO, 19% $Al_2O_3$, and 4% $B_2O_3$, and further included 2.5% of a cobalt aluminate pigment. The results of testing performed on these samples are displayed in Table 1.

TABLE 1

Properties of 430-SS coated with thick film dielectrics

| Dielectric | Dielectric Thickness (μm) | Number of 850° C. refires | IR @ 25° C. Ω (100V) | BDV (volts DC) |
|---|---|---|---|---|
| Prior Art | 86 | 0 | >$10^{12}$ | >6000 |
|  | 86 | 10 | 2 × $10^9$ | <500 |
| Invention | 85 | 0 | >$10^{12}$ | >6000 |
|  | 86 | 10 | >$10^{12}$ | 5500 |

The insulation resistance (IR) and breakdown voltage (BDV) values were measured between the metal base and Electro Science Laboratory's ESL 9695 Pd/Ag pads screen printed and fired onto the dielectric surface. As can be seen by the data in Table 1, the composition of the invention evidences high insulation resistance and minimal change in breakdown voltage after 10 refires at 850° C., compared to the prior art composition. These properties are a decided advantage in applications such as heaters where long-term, high temperature operation is a requirement.

EXAMPLE 2

Tape Lamination

Laminating a dielectric tape to a metal base provides an alternate way of obtaining a dielectric-coated metal substrate. This technique allows the formation of thick, uniform coatings without resorting to multiple printing/firing steps typically associated with thick film processing.

A dielectric tape composition was made as follows. A casting slip was made by mixing the slurry composition of Table 2A in a ball mill.

TABLE 2A

| Slurry: | |
|---|---|
| Glass formulation* | 49.63% |
| Blue pigment | 1.27% |
| Lecithin | 0.2% |
| Butyl Benzyl Phthalate | 4.71% |
| Ethanol | 2.55% |
| Xylene | 10.18% |
| Acryloid B/7 MEK Resin | 31.46% |
| (acrylic copolymer with MEK) | |
| TOTAL | 100% |

This slip was doctor bladed onto a silicone coated MYLAR carrier and dried to remove the solvent, forming a "green tape" having a coating as listed in Table 2B.

TABLE 2B

| Green Tape Formulation | |
|---|---|
| Glass formulation* | 76.05% |
| Blue pigment | 1.95% |
| Lecithin | 0.31% |
| Butyl Benzyl Phthalate | 7.22% |
| Acrylic copolymer | 14.47% |
| TOTAL | 100% |

The insulated metal substrates were made by laminating the green tape to the 430SS substrates described above, applying pressure, removing the MYLAR backing, and firing the coated substrate to remove the thermoplastic binder and densify the glass/pigment mixture, resulting in a coating having the composition of Table 2C.

TABLE 2C

| Fired Tape Formulation | |
|---|---|
| 4914 Glass* | 97.5% |
| Blue pigment | 2.5% |
| TOTAL | 100% |

*Glass Formulation:
$SiO_2$ 40%
CaO 37%
$Al_2O_3$ 19%
$B_2O_3$ 4%

Properties of the laminated substrates are listed in Table 3. As can be seen from the data in Table 3, the tape-coated substrates delivered the same excellent performance characteristics as the screen printed substrates.

TABLE 3

Properties of tape coated stainless steel substrates

| Tape(s) | Dielectric Thickness (μm) | Surface Smoothness Ra (μm) | IR @ 25° C. Ω(100V) | IR @ 350° C. Ω(100) | BDV (volts DC) |
|---|---|---|---|---|---|
| Invention | 130 | 35 | >10$^{12}$ | 3 × 10$^9$ | >6000 |

The linear thermal expansion coefficient of the dielectric tape is lower than the 430-SS. This can result in substrate bowing, but also provides the advantage of putting the dielectric coating in the stronger, compressive state. Warpage can be minimized, if desired, by reducing dielectric film thickness and/or by coating both sides. Use of an insulating dielectric having a TCE that more closely matches the metal is also effective.

Adhesion of the dielectric to the 430 stainless steel was excellent, as indicated by thermal shock and drop testing. The drop test consisted of allowing the coated substrates to fall 2 meters onto a concrete floor ten times and examining them for cracks. Thermal shock testing was done by immersing 700° C. furnace preheated parts into water. After this test was repeated five times the parts were examined for cracking. Dye testing showed no cracking in either test.

It should be noted that the invention should not be limited to the preferred embodiments of the invention disclosed herein. Other embodiments and variations will be apparent to those of ordinary skill in the art without departing from the inventive concepts contained herein.

What is claimed is:

1. A dielectric material comprising at least about 50% of a glass composition having:
   a.) about 35–50% $SiO_2$;
   b.) about 30–40% of an alkaline earth metal oxide selected from the group consisting of CaO, MgO, and SrO;
   c.) about 13–22% $Al_2O_3$; and
   d.) about 0–10% $B_2O_3$, said percentages being weight percentages based on the weight of the total glass composition.

2. The dielectric material of claim 1, wherein said alkaline earth metal oxide is CaO.

3. The dielectric material of claim 1, said glass composition having a density of about 2.0 to 3.5 g/cm$^3$.

4. The dielectric material of claim 1, said glass composition having a softening point (as determined by the Labino method) of about 750°–900° C.

5. The dielectric material of claim 1, said glass composition having a linear thermal expansion coefficient in the range of about 6.0 to 9.0 ppm/° C.

6. The dielectric material of claim 1, wherein said glass composition is substantially free of oxides of alkali metals.

7. The dielectric material of claim 1, further comprising less than about 5% of a glass pigment.

8. The dielectric material of claim 7, wherein said glass pigment is a cobalt-aluminate pigment.

9. A coated substrate comprising a metal substrate having thereupon a dielectric material comprising at least about 50% of a glass composition having a.) about 35–50% $SiO_2$;
   b.) about 30–40% of an alkaline earth metal oxide selected from the group consisting of CaO, MgO, and SrO;
   c.) about 13–22% $Al_2O_3$; and
   d.) about 0–10% $B_2O_3$, said percentages being weight percentages based on the weight of the total glass composition.

10. The coated substrate of claim 9, wherein said alkaline earth metal oxide is CaO.

11. The coated substrate of claim 9, said glass composition having a density of about 2.0 to 3.5 g/cm$^3$.

12. The coated substrate of claim 9, said glass composition having a softening point (as determined by the Labino method) of about 750°–900° C.

13. The coated substrate of claim 9, said glass composition having a linear thermal expansion coefficient in the range of about 6.0 to 9.0 ppm/° C.

14. The coated substrate of claim 9, wherein said glass composition is substantially free of oxides of alkali metals.

15. The coated substrate of claim 9 further comprising less than about 5% of a glass pigment.

16. The coated substrate of claim 15, wherein said glass pigment is a cobalt-aluminate pigment.

17. The coated substrate of claim 9, wherein said substrate is stainless steel.

18. A heater apparatus comprising
   a) a metal substrate having a surface;
   b) a dielectric coating layer on said surface of said metal substrate, said dielectric coating layer comprising at least about 50% of a glass composition having
      about 35–50% $SiO_2$;
      about 30–40% of an alkaline earth metal oxide selected from the group consisting of CaO, MgO, and SrO;
      about 13–22% $Al_2O_3$; and
      about 0–10% $B_2O_3$, said percentages being weight percentages based on the weight of the total glass composition; and
   c) a heating element on said dielectric coating layer.

19. The heater apparatus of claim 18, wherein said alkaline earth metal oxide is CaO.

20. The heater apparatus of claim 18, said glass composition having a density of about 2.0 to 3.5 g/cm$^3$.

21. The heater apparatus of claim 18, said glass composition having a softening point (as determined by the Labino method) of about 750°–900° C.

22. The heater apparatus of claim 18, said glass composition having a linear thermal expansion coefficient in the range of about 6.0 to 9.0 ppm/° C.

23. The heater apparatus of claim 18, wherein said glass composition is substantially free of oxides of alkali metals.

24. The heater apparatus of claim 18 further comprising less than about 5% of a glass pigment.

25. The heater apparatus of claim 24, wherein said glass pigment is a cobalt-aluminate pigment.

26. The heater apparatus of claim 18, wherein said substrate is stainless steel.

* * * * *

UNITED STATES PATENT AND TRADEMARK OFFICE
CERTIFICATE OF CORRECTION

PATENT NO. : 5,998,036
DATED : December 7, 1999
INVENTOR(S) : Sidney J. Stein, et al.

It is certified that error appears in the above-identified patent and that said Letters Patent is hereby corrected as shown below:

Column 1, line 13, "DEVELOPTMENT", should read --DEVELOPMENT--;

Column 3, line 19, "Examples", should read --examples--; and

Column 5, line 9, "(100)", should read --(100V)--.

Signed and Sealed this

First Day of May, 2001

Attest:

NICHOLAS P. GODICI

*Attesting Officer*   Acting Director of the United States Patent and Trademark Office